(12) United States Patent
Zuccolotto et al.

(10) Patent No.: US 11,366,192 B2
(45) Date of Patent: Jun. 21, 2022

(54) MRI PHANTOM HAVING FILAMENTS OF INTEGRAL TEXTILE AXON SIMULATIONS AND ANISOTROPIC HOMOGENEITY MRI PHANTOM USING THE FILAMENTS

(71) Applicants: Psychology Software Tools, Inc., Sharpsburg, PA (US); University of Pittsburgh—Of the Commonwealth System of Higher Education, Pittsburgh, PA (US)

(72) Inventors: Anthony P. Zuccolotto, Freeport, PA (US); John Dzikiy, Pittsburgh, PA (US); Leroy K. Basler, Irwin, PA (US); Benjamin A. Rodack, Pittsburgh, PA (US); Walter Schneider, Pittsburgh, PA (US); Sudhir K Pathak, Pittsburgh, PA (US)

(73) Assignees: PSYCHOLOGY SOFTWARE TOOLS, INC, Sharpsburg, PA (US); UNIVERSITY OF PITTSBURGH—OF THE COMMONWEALTH SYSTEM OF HIGHER EDUCATION, Pittsburgh, PA (US)

(*) Notice: Subject to any disclaimer, the term of this patent is extended or adjusted under 35 U.S.C. 154(b) by 0 days.

(21) Appl. No.: 17/124,232

(22) Filed: Dec. 16, 2020

(65) Prior Publication Data
US 2021/0141042 A1    May 13, 2021

Related U.S. Application Data

(63) Continuation of application No. PCT/US2019/037525, filed on Jun. 17, 2019.
(Continued)

(51) Int. Cl.
*G01R 33/58* (2006.01)
*G01R 33/48* (2006.01)

(52) U.S. Cl.
CPC ......... *G01R 33/58* (2013.01); *G01R 33/4804* (2013.01)

(58) Field of Classification Search
USPC ........................................................ 324/307
See application file for complete search history.

(56) References Cited

U.S. PATENT DOCUMENTS 6,409,515 B1    6/2002 Persohn et al.
6,720,766 B2    4/2004 Parker et al.
(Continued)

FOREIGN PATENT DOCUMENTS

WO    2017/075690    5/2017
WO    2016007939     6/2017

*Primary Examiner* — Rodney E Fuller
(74) *Attorney, Agent, or Firm* — Blynn L. Shideler; Krisanne Shideler; BLK Law Group (57) ABSTRACT

An MRI phantom for calibrated anisotropic imaging includes a plurality of separate sheathed taxons or integral taxons sharing common taxon walls, wherein each taxon has an inner diameter of less than 2 microns. The taxons form taxon filaments that are combined to form taxon ribbons. The taxons may have an average inner diameter of less than 1 micron, specifically about 0.8 microns with a packing density of about 1,000,000 per square millimeter. The filaments may include structural features such as an outer frame and crossing support ribs and may further include a visible alignment feature that allows for verifying orientation of an individual filament. The taxons may be formed as taxon fibers manufactured using a bi or tri-component textile/polymer manufacturing process. An anisotropic homogeneity phantom may include frame members that support fiber tracks extending in orthogonal directions, wherein each fiber track is formed of taxons.

19 Claims, 5 Drawing Sheets

Related U.S. Application Data (60) Provisional application No. 62/846,223, filed on May 10, 2019, provisional application No. 62/685,994, filed on Jun. 16, 2018.

(56) References Cited

U.S. PATENT DOCUMENTS

| | | |
|---|---|---|
| 6,744,039 B1 | 6/2004 | DiFilippo |
| 7,521,931 B2 | 4/2009 | Ogrezeanu et al. |
| 7,529,397 B2 | 5/2009 | Wang et al. |
| 7,667,458 B2 | 2/2010 | Yoo et al. |
| 7,994,784 B2 * | 8/2011 | Yanasak ............ G01R 33/56341 324/307 |
| 8,076,937 B2 | 12/2011 | Holthuizen et al. |
| 8,134,363 B2 | 3/2012 | Yanasak et al. |
| 8,593,142 B2 | 11/2013 | Mori et al. |
| 8,643,369 B2 | 2/2014 | Krzyzak |
| 9,603,546 B2 | 3/2017 | Horkay et al. |
| 10,078,124 B2 | 9/2018 | Horkay et al. |
| 10,172,587 B2 | 1/2019 | Franke et al. |
| 10,180,483 B2 | 1/2019 | Holdsworth et al. |
| 10,261,161 B2 | 4/2019 | Wang et al. |
| 10,274,570 B2 | 4/2019 | Suh et al. |
| 2006/0195030 A1 | 8/2006 | Ogrezeanu et al. |
| 2007/0124117 A1 | 5/2007 | Zhang |
| 2009/0190817 A1 * | 7/2009 | Yanasak ............ G01R 33/56341 382/131 |
| 2012/0068699 A1 | 3/2012 | Horkay et al. |
| 2013/0113481 A1 | 5/2013 | Kim et al. |
| 2013/0279772 A1 | 10/2013 | Stedele |
| 2016/0363644 A1 | 12/2016 | Wang et al. |
| 2017/0184696 A1 | 6/2017 | Zuccolotto et al. |
| 2017/0242090 A1 | 8/2017 | Horkay et al. |
| 2017/0336490 A1 | 11/2017 | Suh et al. |
| 2018/0252790 A1 | 9/2018 | Vesanen et al. |
| 2018/0335498 A1 * | 11/2018 | Attariwala ............ A61B 5/055 |
| 2019/0033419 A1 | 1/2019 | Golay et al. |

* cited by examiner

MRI PHANTOM HAVING FILAMENTS OF INTEGRAL TEXTILE AXON SIMULATIONS AND ANISOTROPIC HOMOGENEITY MRI PHANTOM USING THE FILAMENTS

CROSS REFERENCE TO RELATED APPLICATIONS

This application is a continuation of international patent application serial number PCT/US2019/037525 filed Jun. 17, 2019 titled "MRI Phantom having Filaments of Integral Textile Axon Simulations and Anisotropic Homogeneity MRI Phantom Using the Filaments" which published Dec. 19, 2019 as WO 2019/241792, which is incorporated herein by reference.

International patent application serial number PCT/US2019/037525 claims the benefit of U.S. Provisional Patent Application Ser. No. 62/685,994 filed Jun. 16, 2018 titled "Anisotropic Homogeneity Phantom including Hollow Integrated Tubular Textile Bundles for Calibrated Anisotropic Imaging; MRI Compatible Temperature Measurement; and Expansion Bladder" which application is incorporated herein by reference.

International patent application serial number PCT/US2019/037525 claims the benefit of U.S. Provisional Patent Application Ser. No. 62/846,223 filed May 2, 2019 titled "Anisotropic Homogeneity Phantom including Hollow Integrated Tubular Textile Bundles for Calibrated Anisotropic Imaging; MRI Compatible Temperature Measurement; and Expansion Bladder" which application is incorporated herein by reference.

This application is related to International Application No PCT/US2015/040075 filed on Jul. 11, 2015 and which published Jan. 14, 2016 as Publication WO 2016/007939, and to U.S. patent application Ser. No. 15/403,304 filed on Jan. 11, 2017 and which published Jun. 29, 2017 as U.S. Pat. Publication No. 2017-0184696, which publications are incorporated herein by reference in their entireties.

BACKGROUND INFORMATION

1. Field of the Invention

The present invention relates to an MRI phantom for calibration and validation for anisotropic and isotropic imaging including filaments of integral textile axon simulations and anisotropic homogeneity MRI phantom using the filaments.

2. Description of the Related Art

Magnetic Resonance Imaging

Since inception in the 70's, Magnetic Resonance Imaging (MRI) has allowed research and diagnostic imaging of humans and animals. MRI involves using a combination of high strength magnetic fields and brief radio frequency pulses to image tissue, typically by imaging the dipole movement/spin of hydrogen protons. MRI has long provided two- and three-dimensional imaging of internal tissue, tissue structure, and can provide imaging of functioning processes of tissue called "Functional MRI" or fMRI.

Diffusion MRI (or dMRI), also referred to as diffusion tensor imaging or DTI, is an MRI method and technology which allows the mapping of the diffusion process of molecules, mainly water, in biological tissue non-invasively. Diffusion tensor imaging (DTI) is important when a tissue, such as the neural axons of white matter in the brain or muscle fibers in the heart, has an internal fibrous structure analogous to the anisotropy of some crystals. Water will then diffuse more rapidly in the direction aligned with the internal structure, and more slowly as it moves perpendicular to the preferred direction.

The work in MRI has permitted highly detailed neural pathway mapping, sometimes known tractography or fiber tracking. Tractography or fiber tracking is a 3D MRI modeling technique used to visually represent neural tracts (or other biologic tracts) using data collected by DTI. One MRI technology is known as high-definition fiber tracking, or HDFT, and is used to provide extremely highly detailed images of the brain's fiber network accurately reflecting brain anatomy observed in surgical and laboratory studies. HDFT MRI scans can provide valuable insight into patient symptoms and the prospect for recovery from brain injuries, and can help surgeons plan their approaches to remove tumors and abnormal blood vessels in the brain. HDFT is an MRI imaging tool that is based on the diffusion of water through brain cells that transmit nerve impulses. Like a cables or wire, each tract is composed of many fibers and contains millions of neuronal connections. Other MR-based fiber tracking techniques, such as diffusion tensor imaging, cannot accurately follow a set of fibers when they cross another set, nor can they reveal the endpoints of the tract on the surface of the brain.

The instant application references the work discussed at the Schneider Laboratory at the LRDC (http://www.lrdc.pittedu/schneiderlab/) for further background on the advancement, current status, and potential of anisotropic imaging and fiber tracking techniques with advanced MRI technologies, which work forms the background for the present invention. Related Publications WO 2016/007939 and U.S. Pat. Pub. No. 2017-0184696, which publications are incorporated herein by reference, provide a detailed background with further source citations in this field. The Schneider Laboratory works with the Neurological Surgery Department at UPMC to visualize fiber tracts within the brain in three dimensions in order to plan the most effective and least damaging pathways of tumor excision in patients suffering from various forms of brain cancer. Additionally, the Schneider Laboratory has utilized HDFT to localize the fiber breaks caused by traumatic brain injuries (TBI), which cannot reliably be seen with the then current standard computed axial tomography (CAT or CT) scans or then available MRI scans in mild traumatic brain injury (mTBI), aiding the diagnosis and prognosis of patient brain trauma.

Others have developed fiber tracking technologies using MRI based scans. Consider, the S. Mark Taper Foundation Imaging Center at Cedars-Sinai which offers diffusion tensor imaging (DTI) fiber tracking and functional (fMRI) motor mapping using magnetic resonance imaging fused with 3D anatomical image of a brain to aid in surgical planning.

Related Publications WO 2016/007939 and U.S. Pat. Publication No. 2017-0184696 discus related background patents in this field including U.S. Pat. Publication No. 2006-0269107, now U.S. Pat. No. 7,529,397 developed by Siemens Medical Solutions USA, Inc.; Johns Hopkins University's U.S. Pat. No. 8,593,142; U.S. Pat. Publication No. 2006-0165308 U.S. Pat. No. 8,076,937, developed by Koninklijke Philips Electronics N.V. of Eindhoven, NL; U.S. Pat. Publication No. 2013-00113481 developed by Samsung Electronics Co. LTD; U.S. Pat. Publication No. 2007-0124117; and U.S. Pat. Publication No. 2013-0279772.

MRI Phantoms

As advanced MRI systems and technologies are developed, tested and/or placed in operation, the accuracy of the technology must be verified or validated. Validation may be defined as process wherein the accuracy of the technology/ imaging algorithms is proven or verified. Consider that without proper validation, the most advanced and most detailed fiber tracking systems would be merely devices that make really cool and expensive images without practical application. Further, the accuracy of the associated systems must also be periodically verified, i.e., MRI system periodically calibrated—also referenced as Quality Control aspects, to ensure original and ongoing accurate results and safe operation of the MRI systems.

Generally speaking, calibration and/or test measurements for an MRI system are performed using an imaging phantom or more commonly referenced as simply a phantom. A phantom is any structure that contains one or more known tissue substitutes, or known MRI signal substances, forming one or typically more test points, and often is used to simulate the human body. A tissue substitute is defined as any material that simulates a body of tissue. Thus a phantom may be defined as a specially designed object that is scanned or imaged in the field of medical imaging to evaluate, analyze, and tune the performance of various imaging devices. A phantom is more readily available and provides more consistent results than the use of a living subject or cadaver, and likewise avoids subjecting a living subject to direct risk.

Numerous phantoms have been developed for various imaging techniques. Related Publications WO 2016/007939 and U.S. Pat. Publication No. 2017-0184696 discus related background phantom patents including U.S. Pat. Nos. 8,643, 369, 8,134,363, 7,667,458, 7,521,931, 6,744,039, and 6,720, 766, and U.S. Pat. No. 6,409,515, U.S. Pat. Pub. Nos. 2018-0161599, 2017-0242090, 2016-0363644, 2012-0068699, and 2006-0195030. See also U.S. Pat. Nos. 10,274,570, 10,261,161, 10,180,483, 10,172,587, 10,078, 124, and 9,603,546, and U.S. Pat. Pub. Nos. 2019-0033419; 20180252790 and 2017-0336490. The above identified patents and publications are incorporated herein by reference. Related Publications WO 2016/007939 and U.S. Pat. Publication No. 2017-018696 discus related background phantom articles providing a comprehensive background on phantoms Physical phantoms, as described and discussed above, provide a different balance between ground truth control and realism, to that provided by computer simulations. The above identified patents and patent applications are incorporated herein by reference and the art firmly establish the continued need for effective MRI phantoms for anisotropic and isotropic imaging for validating and calibrating fiber tracking technologies and systems. For fiber tracking phantoms there is a need to have tracking fibers that approximate human axons, which has proved difficult in the past. Related Publications WO 2016/007939 and U.S. Pat. Publication No. 2017-018696 disclose textile-based axon simulation fibers or tracts having an outer diameter of less than 50 microns and an inner diameter of less than 20 microns, and although these are a great improvement over prior art, there remains a need for further improvement. The international search report in the parent application International patent application serial number PCT/US2019/037525 of Nov. 7, 2019 identified Publications WO 2016/007939, WO 2017/ 075690 and U.S. Patent Publication 2006/0195030 as documents of general interest in the art which is not considered to be of particular relevance, and further that the claims defined novelty, inventive step and industrial applicability over the art.

SUMMARY OF THE INVENTION

The present invention addresses fiber tracking phantoms, and the present application is defining certain terms to be used herein. The term "taxon" is defined within this application as a textile based axon simulation having an outer diameter of less than 50 microns and an inner diameter of less than 20 microns, generally much smaller than this range, but this range is suitable for defining the term. Thus a taxon can be considered a single tube, often filled with fluid. The phrase "taxon fiber" is defined within this application as a collection or bundle of taxons, and the taxon fiber may be formed with integral taxons that share outer walls. The phrase "taxon filament" is defined within this application as a taxon fiber with peripheral modification, such as placing a sheath around a bundle of taxons that form a taxon fiber, or trimming/shaping the edges of a taxon fiber to form a polygon taxon filament that allows for tighter packing. The phrase "taxon ribbon" is defined within this application as a bundled or attached collection of taxon fibers or taxon filaments, typically taxon filaments.

One aspect of the present invention provides an MRI phantom for calibrated anisotropic imaging comprising a plurality of taxons, wherein each taxon has an inner diameter of less than 2 microns and wherein the taxons include at least one of i) are integral and share common taxon walls, and ii) are formed within an outer sheath. The MRI phantom according to the invention may provide wherein the taxons form at least one taxon filament in the MRI phantom and wherein a plurality of taxon filaments are combined to form at least one taxon ribbon. The MRI phantom according to the invention may provide wherein the taxons have an average inner diameter of less than 1 micron, specifically about 0.8 microns and wherein adjacent taxons have a minimal wall thickness of 0.2 microns. The MRI phantom according to the invention may provide wherein the taxons have a packing density of about 1,000,000 per square millimeter.

The MRI phantom according to the invention may provide wherein the taxons are formed in taxon filaments which include structural features such as an outer frame and crossing support ribs. The MRI phantom may further include a visible alignment feature that allows for verifying orientation of an individual taxon filament.

The MRI phantom according to the invention may provide wherein the taxons are formed as taxon fibers manufactured using a bi or tri-component textile/polymer manufacturing process.

The MRI phantom according to one aspect of the invention include one phantom section formed as an anisotropic homogeneity phantom having frame members that support fiber tracks extending in mutually orthogonal directions, wherein each fiber track is formed of taxons formed in taxon filaments.

These and other aspects of the invention are set forth in the following description of the preferred embodiments taken together with the attached figures in which like reference numerals represent like elements throughout.

DESCRIPTION OF THE PREFERRED EMBODIMENTS OF THE INVENTION

Figure 1A:
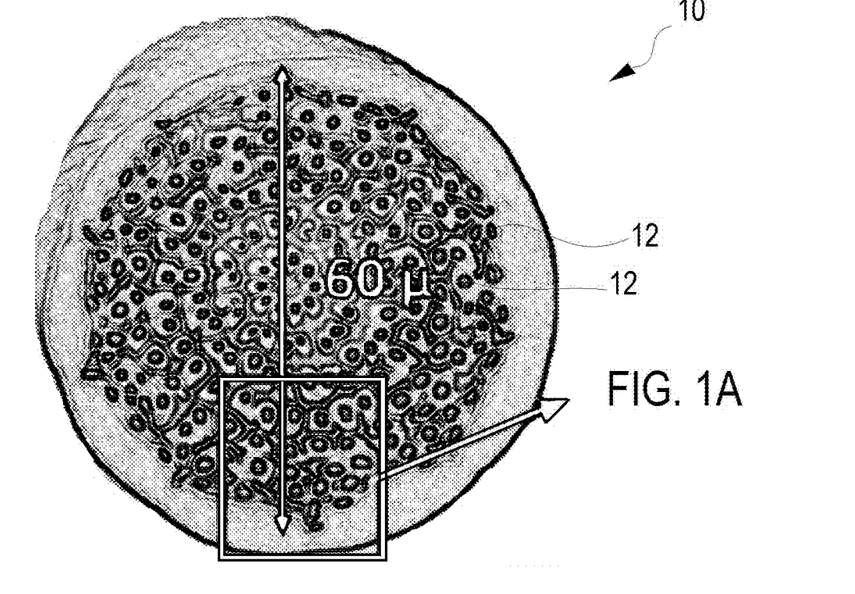
FIG. 1A is a scanning microscope image of taxon filament according to a first embodiment of the present invention having an annular array of separate individual taxons.

For fiber tracking phantoms there is a need to have tracking fibers that approximate human axons, which has proved difficult in the past. FIG. 1A is an image of taxon filament 10 according to a first embodiment of the present invention. In this embodiment each taxon 12, or textile-based axon simulation, has an inner diameter of less than 2 microns, generally less than 1 micron. The taxon filament 10 has an outer diameter of about 60 microns. The individual separate taxons 12, which may be filled with water or other desired fluid, are bundled to form a taxon fiber 10 and a sheath 14 having a thickness of about 4.5 microns surrounds the bundled taxons 12 to form the taxon filament 10. In this embodiment, the peripheral modification to the bundled taxons 12 converting the taxon fiber to a taxon filament 10 is the addition of the outer sheath 14.

Figure 1B:
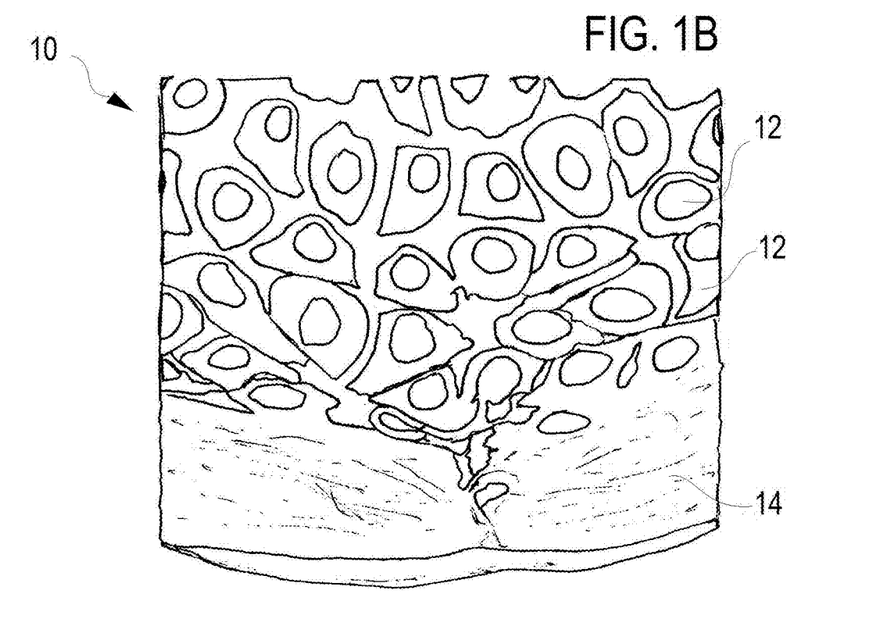
FIG. 1B is an enlarged view of a portion of the image of the taxon filament of FIG. 1A.
Figure 2:
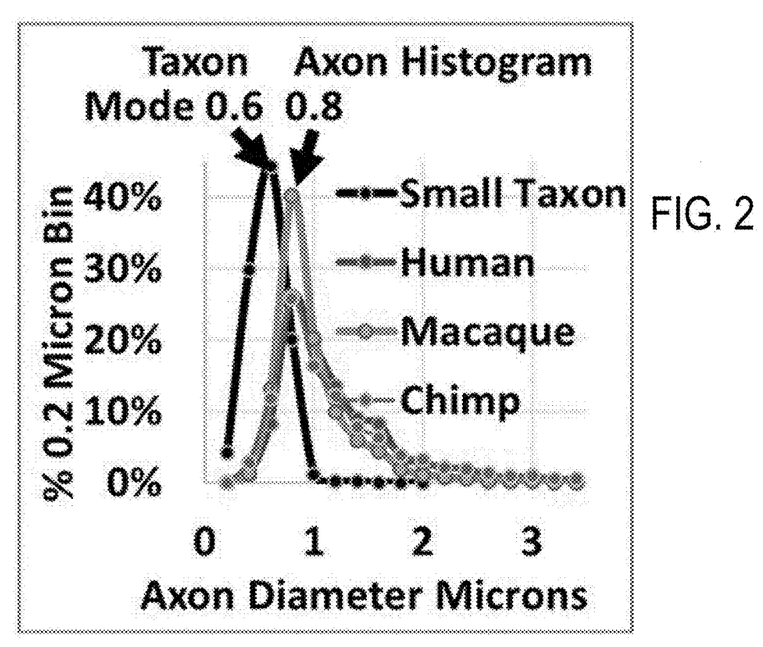
FIG. 2 is a chart of the distribution of the inner diameters of the taxons of FIGS. 1A and 1B compared with reference axon distributions.

FIG. 2 is a chart or histogram that illustrates the inner diameter distribution range of the taxons 12 of the taxon filament 10 of FIGS. 1A and B. The chart of FIG. 2 also compared with reference axon distributions. The chart in FIG. 2 demonstrates a mode of about 0.6-micron inner diameter for the measured taxons 12 of the taxon filament 10 in this example, over a range of about 0.2 to about 2 microns, with the vast majority of inner diameters of taxons 12 being below 1 micron. Subsequent measured results over greater number of examples of taxons 12 consistently show the mode at 0.8 microns, over a range of about 0.2 to less than about 2 microns, again with the vast majority of inner diameters of taxons 12 being below 1 micron. This distribution of inner diameters of taxons 12 favorably matches with axon distributions of relevant populations as evidenced in FIG. 2.

Figure 3A:
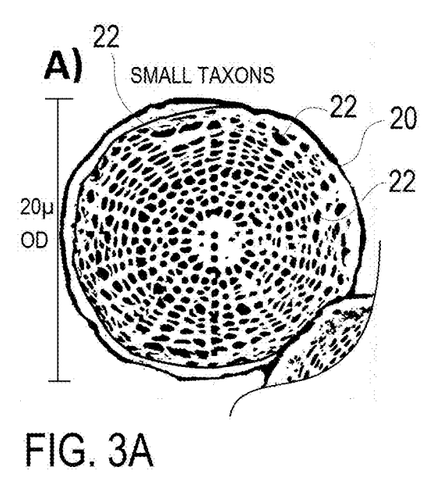
FIG. 3A is a scanning microscope image of taxon fiber according to a second embodiment of the present invention having an annular array of integrated individual taxons.

FIG. 3A is an image of taxon fiber 20 according to a second embodiment of the present invention. In this embodiment each taxon 22, or textile-based axon simulation, has an inner diameter of less than 2 microns, generally less than 1 micron. The taxon fiber 20 has an outer diameter of about 20 microns. In this embodiment the taxons 22 are integral to each other within the taxon fiber 20 as they share common walls. Within the meaning of this application "integral" taxons are those, such as taxons 22 of taxon fiber 20 that share common walls. The taxons 22 are formed in concentric annular arrays within the taxon fiber 20 around a circular central core 24 and results in much greater or tighter packing of axons within a given space. The taxon fiber 20 contains more than 200 fibers with average inside diameter (ID) of less than 1000 nanometers, with the specific illustrated embodiment containing 540 taxons 22 with average inside diameter (ID) of 595 nanometers. Again, the individual integrated taxons 22 may be filled with water or other desired fluids. A collection of taxon fibers 20 may be bundled into ribbons in the manner discussed below. The taxon fibers 20 may be processed into polygon shapes for tighter ribbon packing as detailed below, however the concentric annular arrays, also known as radial arrays, are generally preferred where the taxon fibers 20, rather than taxon filaments, are used to form taxon ribbons. The use of taxon fibers 20 to form ribbons such as to allow interstitial spaces between the taxon fibers 20 in a given tract formed by the ribbon.

Figure 3B:
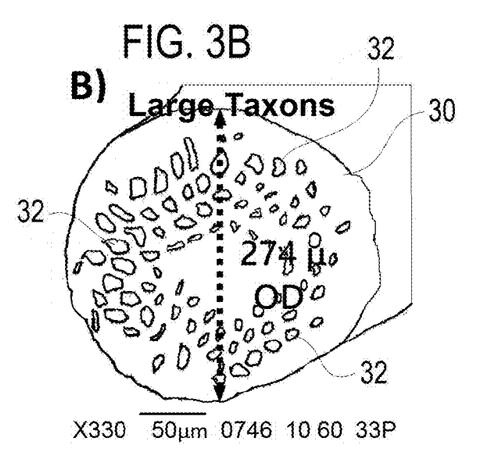
FIG. 3B is a scanning microscope image of taxon fiber according to a third embodiment of the present invention having an annular array of integrated individual large diameter taxons.

In some applications the phantom may desire to have higher diameter taxons 32 within a taxon fiber 30. FIG. 3B shows a "large taxon" based taxon fiber 30 of less than 350-micron outer diameter, and specifically the illustrated taxon fiber 30 has a 274-micron OD containing 72 "large diameter" taxons 32 with an average ID of 11,773 nanometers. The taxons 32 have an inner diameter ranging from 2-18 microns in this "large taxon" based taxon fiber 30. These integral taxons 32 extend to the upper ranges of what is considered taxons (ID less than about 20 microns) within this application. Similar to taxon fiber 20, the taxons 32 are formed in an annular array within the taxon fiber 30. The taxons 32 are formed in linear patterns around a generally rectangular core 34. Again, the individual integral taxons 32 may be filled with water or other desired fluids. A collection of taxon fibers 30 may be bundled into ribbons in the manner discussed in detail herein.

Figures 4, 5A, 5B:
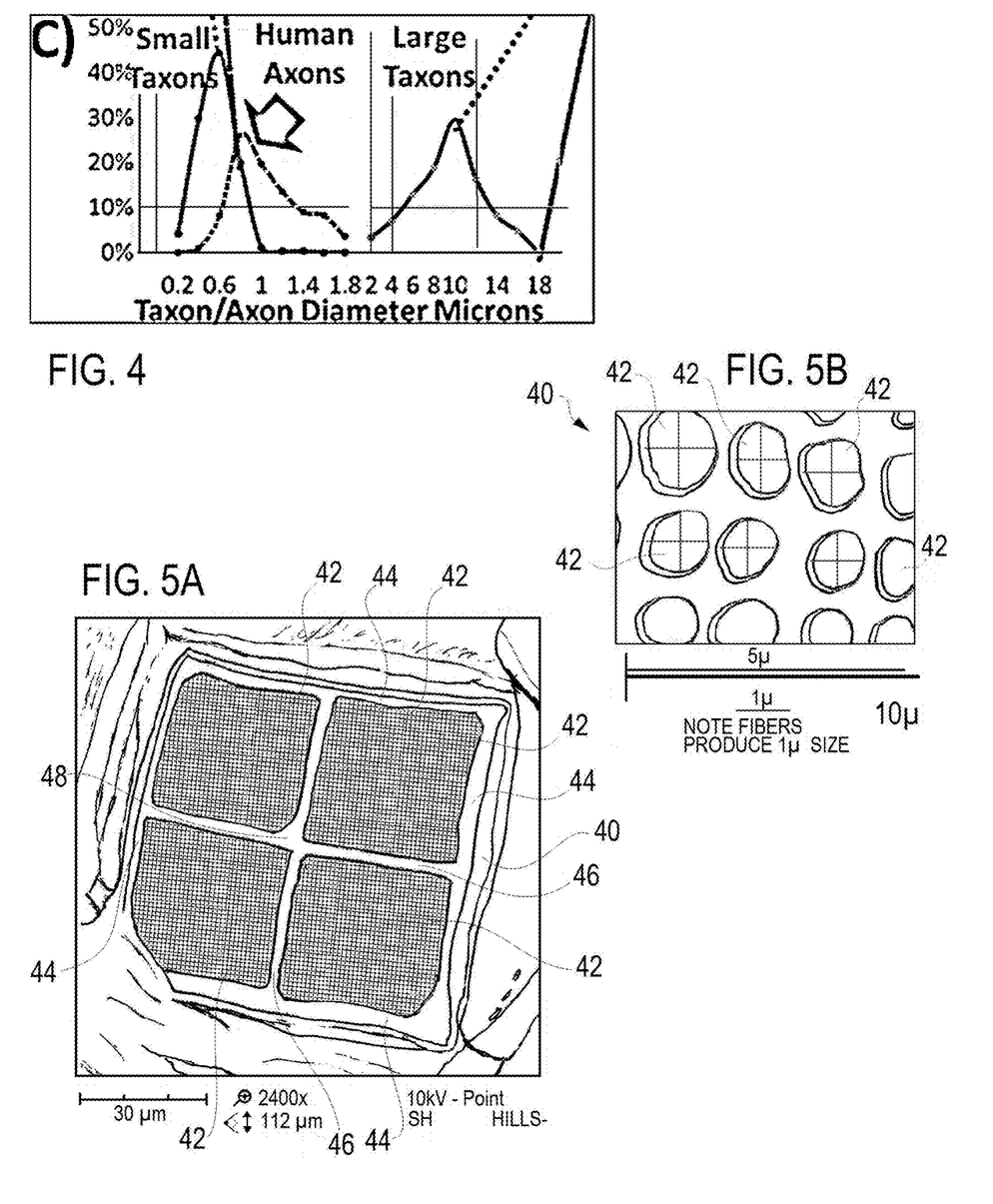
FIG. 4 is a chart of the distribution of the inner diameters of the taxons of FIGS. 3A and 3B compared with reference human axon distributions.
FIG. 5A is a scanning microscope image of taxon filament according to a fourth embodiment of the present invention having an rectangular array of integrated individual taxons with intervening ribs and alignment features.
FIG. 5B is a scanning microscope image of a portion of the taxon filament of FIG. 5A.

FIG. 4 illustrates the inner diameter distribution range of the taxons 22 of the taxon fiber 20 of FIGS. 3A and of the taxons 32 of the taxon fiber 3B and B. The chart of FIG. 4 also compared with reference human axon distributions. The chart demonstrates a mode of 0.6-micron inner diameter for the taxons 22 of the present invention over a range of about 0.2 to 2 microns, with the vast majority below 1 micron. This distribution of taxon 22 inner diameters matches axon distributions of relevant populations quite favorable. The chart demonstrates a mode of about 10-micron inner diameter for the taxons 32 of the present invention over a range of about 2 to 18 microns.

FIG. 5A is a scanning microscope image of taxon filament 40 according to a fourth embodiment of the present invention having a rectangular array of integrated individual taxons 42. The taxon filament 40 shows a tight tolerance in the range of taxon inner diameters with each taxon 42 having about a 0.8-micron inner diameter. The taxons 42 are integral to each other within the taxon filament 40 as they share common walls and the common walls have a narrow portion or minimum wall thickness of about 0.2 microns. As noted above, within the meaning of this application "integral" taxons are those, such as taxons 42 of taxon filament 40 that share common walls. The taxons 42 are formed in a close pact rectangular array within the taxon filament 40. Also included are structural features such as outer frame 44 and crossing support ribs 46. The outer frame 44 and support ribs or struts 46 minimize taxon 42 damage during manufacturing of specific phantoms. Additionally, some taxons are omitted adjacent one corner of the crossing ribs 46 to form a visible alignment feature 48 that allows for verifying orientation of an individual taxon filament 40. The orientation of the taxon filament 40 can be important both in manufacturing precise ribbons and resulting phantoms, and in the operation of the resulting phantom. The uniform inner diameters and tight tolerance of the taxons 42 of taxon filament 40 is best shown in FIG. 5B, and this construction results in much greater or tighter packing of taxons 42 within a given space, specifically up to 1,000,000 taxons 42 within a square millimeter. The individual integrated or integral taxons 42 may be filled with water or other desired fluids. A collection of taxon filaments 40 may be bundled into ribbons in the manner discussed below.

Figure 6:
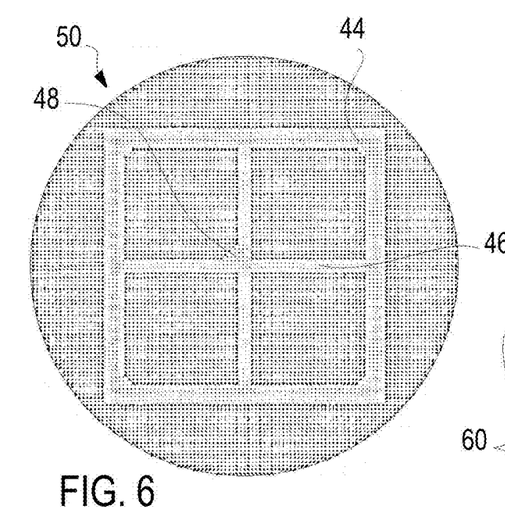
FIG. 6 is a schematic plan view of a forming template of a taxon fiber forming the taxon filament of FIG. 5A.

FIG. 6 is a schematic plan view of a forming template of a taxon fiber 50 forming the taxon filament 40 of FIG. 5A. The taxon filaments 40 are manufactured using a bi or tri-component textile/polymer manufacturing process in the form shown in the template of a taxon fiber 50 shown in FIG. 6. The bi-component/tri-component manufacturing process is existing art in the textile manufacturing world and is available from manufacturers such as Hills, Inc. in Melbourne, Fla. As shown in FIG. 6, the taxon fiber 50 is a round fiber to start and within each taxon fiber there are roughly 3600 0.8-micron inner diameter taxons 42 in a single taxon fiber 50.

In manufacturing the combination of solid material(s), such as nylon or similar material, and dissolvable material(s), such as PVOH or similar material, are arranged in the desired pattern. The solid material forms the walls of the taxons 42 and the structural features such as outer frame 44 and crossing support ribs 46 and the visible alignment feature 48. In the taxon filament 40 only a single solid material is used, but one type may be used for the walls of the taxons 42 and another for the structural features and the alignment feature 48 to allow for differentiation within the MRI.

Figure 7:
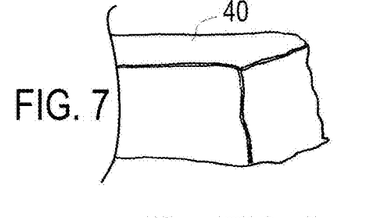
FIG. 7 is a scanning microscope image of a perspective view of the taxon filament of FIG. 5A.

When dissolvable material is removed it will leave holes between continuous thin walls to form the integral taxons 42. It is also used to allow sections of the round shape of the taxon fiber 50 to be removed to form the taxon filament 40. In this instance there is a layer of dissolvable material around the solid outer nylon frame 44 forming a square. The process of forming the polygon taxon filament 40 is known as delamination and FIG. 7 is a scanning microscope image of a perspective view of the taxon filament of FIG. 5A.

The delamination process may use soaking and/or increased humidity together with tension, agitation, pressure, temperature control, exposure duration to selectively dissolve away the dissolvable polymer and leaves only solid structures to form the taxon filament 40. It is optimal to delaminate to first remove the outer unwanted sections of the taxon fiber 50, while preventing the delamination process from also dissolving away any polymer inside the taxons/holes, e.g., ideally these remain filled with dissolvable polymer until a later stage in the process. This staged process allows manufacturing to proceed with a solid (more durable) filament 40 during ribbon 60 assembling and routing of ribbons 60 into fixtures. Then at a final stage the remaining dissolvable polymer is dissolved to evacuate the taxons 42 and re-fill them in a control manner with a desired substance (e.g., water, $D_2O$, an MRI contrast agent, etc.). By delaying this until a late stage, the process minimizes the chance that air gets into the holes of the taxons 42, which could remain in the micron level tube and create a susceptibility artifact in an MRI image. Later stages of the processes may be performed in a nitrogen environment to further reduce the risk of an air/oxygen bubble persisting in the taxons 42.

Figure 8:
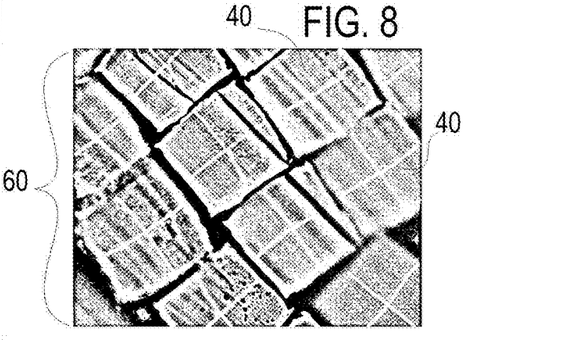
FIG. 8 is a scanning microscope image of a taxon ribbon formed by a plurality of the taxon filaments of FIG. 5A.

A polygon-based structure for taxon filament 40 with straight edges (triangle, square, rectangle, quadrilateral, octagon/honey comb) is more optimal to assure that adjacent filaments 40 pack in closely, and can be purposely fused in post-processing, to form a compact ribbon 60 that eliminates any space between filaments 40. A repeatable, deterministic, and accurate calculation of the area within taxons 42 (holes) as well as between taxon taxons 42 is critical/required to create precise predictive models of diffusion within diffusion MRI. FIG. 8 is a scanning microscope image of a taxon ribbon 60 formed by a plurality of the taxon filaments 40 of FIG. 5A.

The MRI phantoms formed by ribbons 60 form a viable anisotropic diffusion reference measurement object matched to the human axon specification with the 0.8-micron taxons 42 within the ribbons 60 yielding a packing density of $10^6$ per $mm^2$. These ribbons 60 can be configured to duplicate the complexity of fasciculi scale brain connectivity and diffusion chambers. The bi or tri-component manufacturing technology is critical to produce sub-micron scale features in a precise repeatable and controlled fashion using both a dissolvable polymer such as PVOH (polyvinyl alcohol)/PVA (polyvinyl acetate) with a non-dissolvable structure as nylon in the same machine. In scalable operations a ten-foot-high machine outputs a human hair size taxon fiber 50 at the rate of 450 meters per minute.

As noted above, after taxon filaments 40 are created, these are combined into taxon ribbons 60 of desired configurations/dimensions e.g., ribbons 60 may be 1 filament high by 2 filaments wide (rectangular shape), 1×4, 1×6, 1×8, 1×12, 2×2, 2×4, 2×6, 2×8, 2×12.

Precisely combining individual taxon filaments 40 provides structure; allows for a larger size unit that is easier/more feasible to work with without specialized viewing equipment; and most importantly—allows filaments 40 to be bonded together for long runs to assure no space to exist between the straight edges of adjacent filaments 40 (which allows for precise calculation and verification of the exact amount of solid mater or fill material (water) that exists in a given dimensional space/area of a ribbon 60).

Once the filaments 40 are in a square shape (or any polygon shape with straight edges) then the filaments 40 are run over machined surfaces and/or channels to prevent the filament 40 from twisting as they are being combined into ribbons 60. Twisting of the filaments 40 during this process would minimize/reduce the effectiveness of a diffusion calibration device. Computer controlled stepping motors and tensioning devices may be used to pull multiple filaments 40 through a straightening device to eliminate twisting, then the filaments 40 are run through an aperture specifically designed to apply side wall forces that will join adjacent filaments 40 together as they move closer and closer together and through the system. The optimal shape at the junction point is a torus (minimally a ½ of a torus) of a specific dimension (which depends on the size and number of filaments 40 being joined at one time in a ribbon 60. A staged compression approach may be used which allows ribbons 60 to be loose until after the filling process (e.g., to allow filling substance around individual units), then the ribbons 60 may be compressed after to remove space between filaments 40.

The above processes may be used to make "micro phantoms" which have a low number of filaments 40 in a ribbon 60 mounted into a very small fixture, which can be scanned at high resolution (primarily for research studies) in small bore, very high field MRI scanners.

Figure 9:
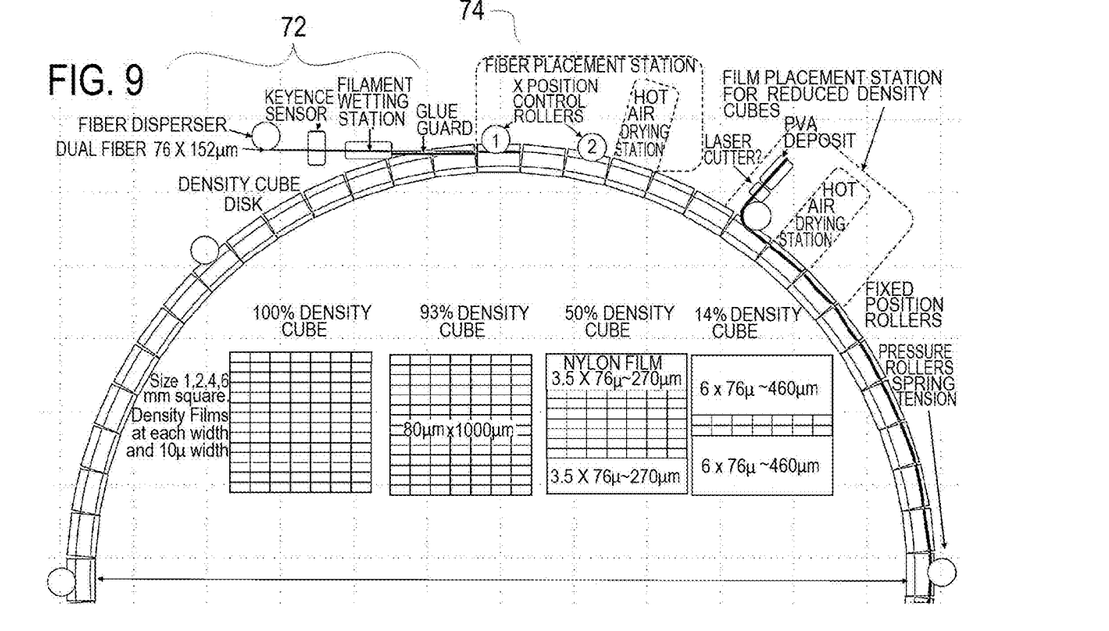
FIG. 9 is a schematic view of an assembly line for forming various ribbons with taxon filaments according to the present invention including representations of distinct density ribbons.

Scaling production of the ribbons 60 is an important aspect of the invention. FIG. 9 is a schematic view of an assembly line 70 for forming various ribbons 60 with taxon filaments 40 according to the present invention including representations of distinct density ribbons 60. The line 70 introduces and aligns multiple filaments 40 and coats with adhesive in initial unit 72 of the line 70 before the line 70 uses precisely control placement of the filaments 42 into fixtures at placement unit 74 and which placement is arranged around a wheel 76. The line 70 can cut the ribbons 60 to a desired length and may selectively add intervening films (non-taxon 42 containing portions) at unit 78 to allow for a desired variation in the taxon 42 density of the resulting ribbon 60. Various densities of ribbons 60 are shown in FIG. 9. In summary the line 70 can tightly wind the ribbons 60 around or through the structure (into the fixtures); secure the ribbons within each fixture; and cut the ribbons 60 into individual segments that can be integrated into an MRI phantom as desired. As an alternative, a modified CNC type routing machine, or on a smaller scale a modified 3D printer, may be used to automate production and also precisely place the fiber within an array of fixtures.

Figure 10:
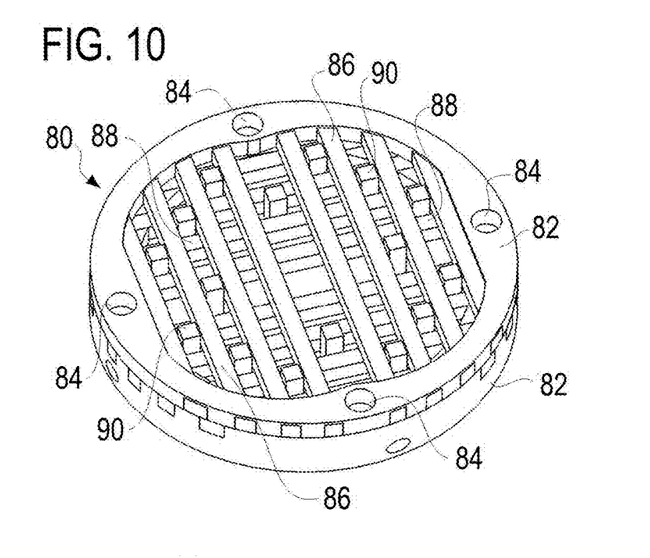
FIG. 10 is a perspective view of an anisotropic homogeneity MRI phantom using ribbons formed of filaments of the present invention.

FIG. 10 is a perspective view of an anisotropic homogeneity MRI phantom 80 using ribbons 60 formed of filaments 40 of the present invention. A key challenge throughout MRI is getting measurements that are quantitatively stable across space. There are added challenges in anisotropic calibration that must account for variations within the X, Y, and Z dimensions. Spatial correction is hard because coil fall offs are quadric with distance in 3D space from the coil loops. A valuable role of a reference phantom is to quantify how close repeatable and accurate the measurement is across space, tensor direction and time of scan.

The phantom 80, also called a disc as it may be a modular component of a larger phantom as discussed below, shown in FIG. 10 is may be described as an anisotropic homogeneity phantom having frame members 82 coupled with fasteners 84 that support ribbons forming tracks 86, 88 and 90 extending in mutually orthogonal directions. The tracks 86, 88 and 90 are formed of ribbons 60 formed by filaments 40 as discussed above. FIG. 10 shows that the taxon ribbons 60 may form the specific X, Y and Z tracks 86, 88 and 90 that are supported in the fixed frames 82 within the phantom 80. For each direction there are preferably at least five tracts each forming at least 10 regions of interests or test points across the phantom 80. Additionally, there may be variations in density of the ribbons 60 in each dimension to allow for checking various fiber densities in each direction. The phantom 80, for example, might provide 400 6×6×6 mm regions of interest (ROIs) or test points, wherein each ROI provides a ground truth measurement of density and angle of the taxons 42 of that ROI. The phantom 80 combines all these features allowing calibration of all three axes and three directional tensors. For simplicity the X, Y dimension tracks 86, 88 are illustrated as non-intersecting. An alternate is that the fiber ribbons 60 forming tracks 86 and 88 in the X, Y dimensions are crossed at each alternating layer adding the utility of a crossing fixture. The same would also apply to the Z dimension if the frame has sufficient depth to cross in this dimension efficiently to produce a crossing of fibers in 3 dimensions that can be used reliably as a phantom. Adding crossing fibers would add additional features but there may be an advantage to keeping the crossing functions for a separate crossing phantom.

Figure 11A:
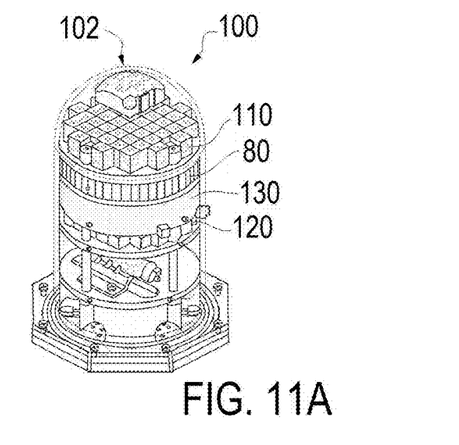
FIG. 11A is a schematic perspective view of a modular MRI phantom including an anisotropic homogeneity MRI phantom disc.
Figure 11B:
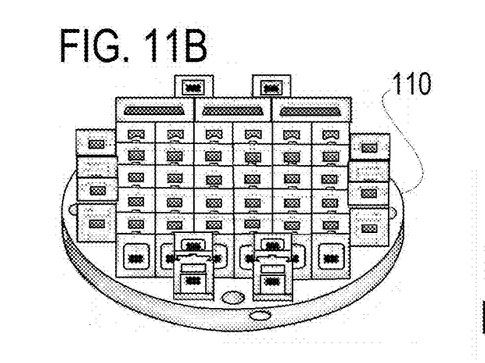
FIGS. 11B-E are schematic representations of the modular MRI phantom discs used with the MRI phantom of FIG. 11A.
Figure 11C:
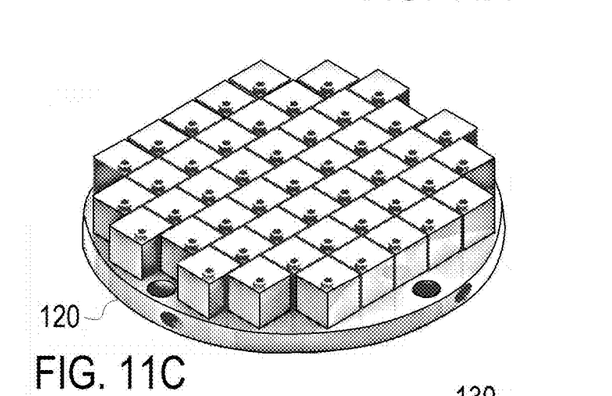
Figure 11D:
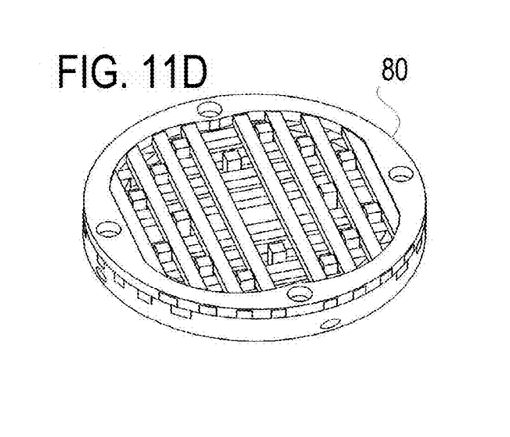
Figure 11E:
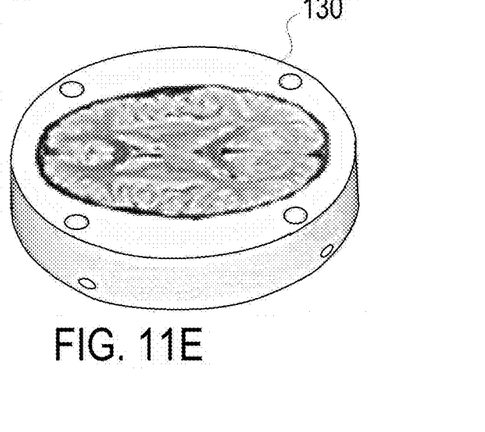

FIG. 11A is a schematic perspective view of a modular MRI phantom 100 including an anisotropic homogeneity MRI phantom 80. The phantom 100 includes a readable serial number 102 to identify the device and a biophysics disc 110, a reference fluid disc 120, and an anatomical disc 130 in addition to the spatial homogeneity disc 80 discussed above. FIGS. 11B-E are schematic representations of the modular MRI phantom discs 80, 110, 120 and 130 used with the MRI phantom 100 of FIG. 11A. The construction of the biophysics and reference fluid and anatomical phantom test points for the discs 110, 120 and 130 are generally known in the art. In general, the biophysics disc 110 will include track crossings and changes in fiber densities, the reference fluid disc 120 includes up to 47 reference fluids and the anatomical disc can demonstrate anatomical variations for testing.

It is apparent that many variations to the present invention may be made without departing from the spirit and scope of the invention. The present invention is defined by the appended claims and equivalents thereto.

What is claimed is:

1. An MRI phantom for calibrated anisotropic imaging comprising a plurality of taxons, wherein each taxon has an inner diameter of less than 1 micron and wherein the taxons include at least one of i) are integral and share common taxon walls, or ii) are formed within an outer sheath.

2. The MRI phantom according to claim 1 wherein the taxons form at least one taxon filament in the MRI phantom.

3. The MRI phantom according to claim 2 wherein a plurality of taxon filaments are combined to form at least one taxon ribbon.

4. The MRI phantom according to claim 1 wherein the taxons have an average inner diameter of about 0.8 microns.

5. The MRI phantom according to claim 4 wherein adjacent taxons have a minimal wall thickness of 0.2 microns.

6. The MRI phantom according to claim 4 wherein the taxons have a packing density of about 1,000,000 per square millimeter.

7. The MRI phantom according to claim 4 wherein the taxons are formed in taxon filaments which include an outer frame.

8. The MRI phantom according to claim 7 wherein the taxon filaments include crossing support ribs.

9. The MRI phantom according to claim 8 wherein the taxon filaments includes a visible alignment feature that allows for verifying orientation of an individual taxon filament.

10. The MRI phantom according to claim 1 wherein the taxons are formed as taxon fibers manufactured using a bi or tri-component textile/polymer manufacturing process.

11. The MRI phantom according to claim 1 including one phantom section formed as an anisotropic homogeneity phantom having frame members that support fiber tracks extending in mutually orthogonal directions, wherein each fiber track is formed of taxons formed in taxon filaments.

12. An MRI phantom for calibrated anisotropic imaging comprising a plurality integral taxons sharing common taxon walls, wherein the taxons are formed as taxon fibers manufactured using a bi or tri-component textile/polymer manufacturing process.

13. The MRI phantom according to claim 12 including one phantom section formed as an anisotropic homogeneity phantom having frame members that support fiber tracks extending in mutually orthogonal directions, wherein each fiber track is formed of taxons formed in taxon filaments.

14. The MRI phantom according to claim 12 wherein the taxons form a plurality of taxon filaments that combine to form at least one taxon ribbon in the MRI phantom.

15. The MRI phantom according to claim 12 wherein the taxons have an average inner diameter of less than 1 micron.

16. The MRI phantom according to claim 15 wherein adjacent taxons have a minimal wall thickness of 0.2 microns.

17. The MRI phantom according to claim 12 wherein the taxons are formed in taxon filaments which include an outer frame and crossing support ribs.

18. An MRI phantom including one phantom section formed as an anisotropic homogeneity phantom having frame members that support fiber tracks extending in mutually orthogonal directions, wherein each fiber track is formed of taxons formed in taxon filaments.

19. The MRI phantom according to claim 18 wherein the taxons have an average inner diameter of less than 1 micron.

* * * * *